(12) United States Patent
Foucher et al.

(10) Patent No.: US 8,723,116 B2
(45) Date of Patent: May 13, 2014

(54) METHOD OF DETERMINING AN APPLICABLE THRESHOLD FOR DETERMINING THE CRITICAL DIMENSION OF AT LEAST ONE CATEGORY OF PATTERNS IMAGED BY ATOMIC FORCE SCANNING ELECTRON MICROSCOPY

(71) Applicant: Commissariat à l' énergie atomique et aux énergies alternatives, Paris (FR)

(72) Inventors: Johann Foucher, Voreppe (FR); Mazan Saied, Meylan (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/886,371

(22) Filed: May 3, 2013

(65) Prior Publication Data

US 2013/0292567 A1 Nov. 7, 2013

(30) Foreign Application Priority Data

May 4, 2012 (FR) ..................................... 12 54130

(51) Int. Cl.
*H01J 37/28* (2006.01)

(52) U.S. Cl.
USPC ........... 250/307; 250/306; 250/310; 250/311; 850/8; 850/9; 850/10; 850/11; 850/22; 382/141

(58) Field of Classification Search
USPC ........... 250/306, 307, 310, 311; 850/8, 9, 10, 850/11, 22; 382/141
See application file for complete search history.

(56) References Cited

U.S. PATENT DOCUMENTS

| | | | |
|---|---|---|---|
| 6,392,229 B1 | 5/2002 | Dana et al. | |
| 7,840,390 B2 * | 11/2010 | Satake et al. | 703/2 |
| 8,214,166 B2 * | 7/2012 | Tanaka et al. | 702/95 |
| 8,300,919 B2 * | 10/2012 | Yamaguchi et al. | 382/141 |
| 2005/0197772 A1 | 9/2005 | Archie et al. | |

FOREIGN PATENT DOCUMENTS

WO    WO 2004/059247    7/2004

OTHER PUBLICATIONS

French Preliminary Research Report dated Nov. 7, 2012 for Appln No. FR 1254130.
Foucher et al.; "Hybrid Metrology for Critical Dimension based on Scanning Methods for IC Manufacturing"; Proceedings of SPIE, vol. 8378, Apr. 23, 2012; pp. 83780F-83780F-8.

(Continued)

*Primary Examiner* — Michael Logie
(74) *Attorney, Agent, or Firm* — Pillsbury Winthrop Shaw Pittman LLP

(57) ABSTRACT

A method of determining an applicable threshold for determining the critical dimension of a category of patterns imaged by atomic force scanning electron microscopy is presented. The method includes acquiring, from a plurality of patterns, a pair of images for each pattern; for each pair of images determining a reference critical dimension via an image obtained by a reference instrumentation and determining an empirical threshold applicable to an image obtained by a CD-SEM instrumentation such that the empirical threshold substantially corresponds to the reference critical dimension; determining a threshold applicable to a category of patterns, the threshold being determined from a plurality of empirical thresholds.

11 Claims, 1 Drawing Sheet

(56) References Cited

OTHER PUBLICATIONS

DataBase Inspec (online); The Institution of Electrical Engineers, Stevenage, GB 2011, Vaid A et al.; "A holistic metrology approach: hybrid metrology utilizing scatterometry, CD-AFM, and CD-SEM", XP002685430; & metrology inspection and process control for microlithography XXV Feb. 28-Mar. 3, 2011 San Jose, CA, USA, vol. 7971, Feb. 28, 2011.

Orji et al.; "A Systematic Approach to Accurate Evaluation of CD-Metrology Tools"; Microelectronic test structures, 2007. ICMTS 07. IEEE International Conference on IEEE, PI, Mar. 1, 2007; pp. 9-13.

DataBase Inspec (online); The Institution of Electrical Engineers, Stevenage, GB 2003, Sendelbach et al.; "Scatterometry measurement precision and accuracy below 70nm", & metrology inspection and process control for microlithography XVII, Feb. 24-27, 2003, San Clara, CA, USA, vol. 5038, Feb. 24, 2003, pp. 224-238.

Knight et al.; "Advanced metrology needs for nanoelectronics lithography" Comptes Rendus_Physique, Elsevier, Paris, France, vol. 7, No. 8, Oct. 1, 2005; pp. 931-941.

DataBase Inspec (online); The Institution of Electrical Engineers, Stevenage, GB 2007, Zangooie et al.; "Characterization of apacitive 3D deep trench mask open structures using scatterometry", & metrology inspection and process control for microlithography XXI, Feb. 26, 2007, San Jose, CA, USA, vol. 6518, Feb. 26, 2007.

\* cited by examiner

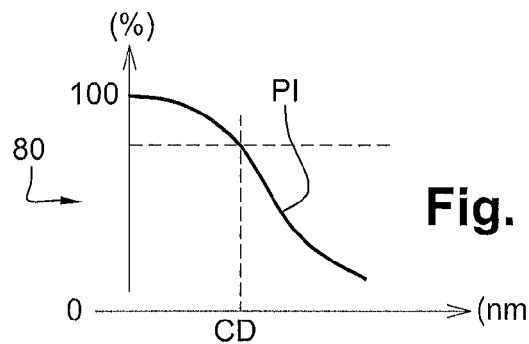
Fig. 1
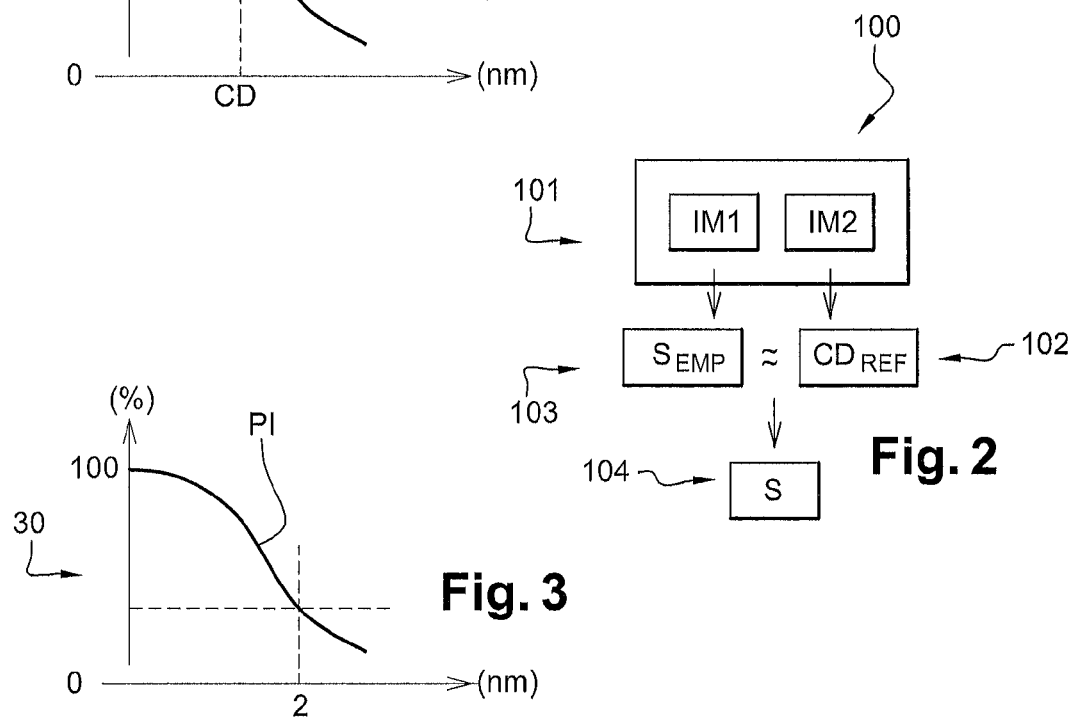
Fig. 2
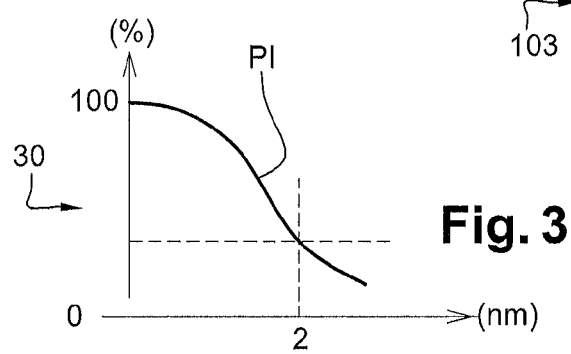
Fig. 3
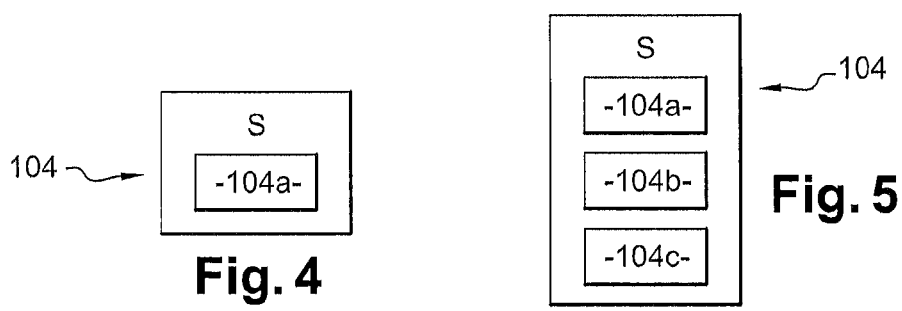
Fig. 4
Fig. 5
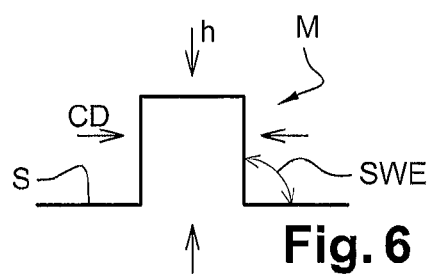
Fig. 6

METHOD OF DETERMINING AN APPLICABLE THRESHOLD FOR DETERMINING THE CRITICAL DIMENSION OF AT LEAST ONE CATEGORY OF PATTERNS IMAGED BY ATOMIC FORCE SCANNING ELECTRON MICROSCOPY

The present invention relates to the field of metrology and its general aspect is a method of determining an applicable optimized threshold for determining the critical dimension of at least one category of patterns imaged by atomic force scanning electron microscopy. This threshold thus determined may then be used in production to characterize patterns, notably those used in microelectronic integrated circuits.

In microelectronics, technological progress goes hand-in-hand with characterization instrument needs. For each technological node, the metrology tools must be increasingly efficient by being capable of ensuring the dimensional control of the devices produced.

To do this, the semiconductor industry defines and follows the dimensions of products produced by using what is called CD ("Critical Dimension"). The permanent decrease in the critical dimensions of circuits involves the corresponding adaptation of measuring methods. Simultaneously, increases in the size of wafers and the costs represented by each of them involve the control and detection of production defects.

One of the problems with this concept of Critical Dimension CD resides in its very definition, which may vary depending on the type of pattern studied; therefore, in the case of holes or dots, the CD will be the diameter; if a line or trench, the CD will be the width of the line or trench.

In addition to the very definition of CD, the vertical position of its measurement varies depending on the patterns to be characterized. Thus, the CD of a transistor gate will instead be measured as low as possible while the CD of a gate contact or an interconnection line will instead be measured as high as possible.

To measure a CD by CD-SEM, a beam of primary electrons is emitted onto the surface of the pattern to be analyzed which, in response, re-emits secondary electrons. These secondary electrons are analyzed by detectors that enable a graph such as illustrated in FIG. 1 to be reconstructed, this graph representing a secondary electron intensity profile IP comprising a percentage of collected secondary electrons on the y-axis and a dimension in nm representative of the CD on the x-axis. Currently it is estimated, often wrongly, that a threshold of secondary electrons empirically obtained, for example 80%, is applicable to any type of pattern. Therefore, the threshold of 80% is applied, and the measured critical dimension is deduced, regardless of the type of pattern analyzed.

An empirical set threshold applied to any type of pattern is even less satisfactory as there is no physical link between the percentage of secondary electrons collected and the real height of the pattern, the critical dimension of which one seeks to determine. In other words, if a measurement of 80% secondary electrons is made, that does not mean that a critical dimension is measured at 80% of the height of the pattern.

In this context, an aspect of the present invention is to provide a method of determining an applicable threshold for determining the critical dimension of at least one category of patterns imaged by atomic force scanning electron microscopy usable in both research and development and in production, enabling a more accurate and realistic value of the desired critical dimension to be given regardless of the production level to be characterized (for example lithography level or etching level).

For this purpose, the invention relates to a method of determining an applicable threshold for determining the critical dimension of at least one category of patterns imaged by atomic force scanning electron microscopy, said method comprising the following steps:
from a plurality of patterns, acquisition of a pair of images for each pattern:
  a first image being obtained by means of an imaging instrumentation implementing the atomic force scanning electron microscopy technique, also known as CD-SEM instrumentation, which one seeks to determine said threshold;
  a second image being obtained by means of a reference imaging instrumentation implementing a different technique from said scanning electron microscopy technique;
for each pair of images obtained for each of the patterns:
  determination of a reference critical dimension via the image obtained by means of said reference imaging instrumentation;
  determination of an empirical threshold applicable to the image obtained by means of said CD-SEM instrumentation such that said empirical threshold substantially corresponds to said reference critical dimension;
Determination of the threshold applicable to at least one category of patterns, said threshold being determined from a plurality of empirical thresholds, each empirical threshold corresponding to a pair of images.

The method according to the invention proposes, unlike current CD metrology, determining a threshold (applicable for at least one category of patterns) substantially approximating the real threshold corresponding to the height at the level of which the critical dimension that one wishes to measure is situated.

Threshold is understood to refer to a percentage of secondary electrons re-emitted by a pattern subjected to a primary electron beam during a CD-SEM measurement.

According to the desired accuracy, it is possible to determine this threshold for:
  a single category of patterns; in this case, the threshold is determined such that it substantially corresponds to the height (i.e., the vertical position) at the level of which the CD is situated on the pattern;
  a plurality of categories of patterns, even any type of pattern; In this case, the threshold determined is adjusted such that it is applicable to the plurality of pattern categories regardless of the height at the level of which each of the CDs of the different pattern categories is situated.

Critical dimension is understood to refer to the Critical Dimension or Critical Dimensions of a pattern representing one or more lengths characteristic of the pattern that prove critical either for mastering the production process or for guaranteeing the electrical performances of the final electronic device constituted of said patterns.

The critical dimension varies according to the type of pattern studied; therefore, in the case of holes or dots, the critical dimension will be the diameter; if a line or trench, the critical dimension will be the width of the line or trench.

The method according to the invention may also present one or more of the characteristics below, considered individually or according to all technically possible combinations:
  the threshold is a constant threshold applicable to all categories of patterns; a constant threshold will be used for identical patterns, for example identical patterns measured on a production wafer; if the CD varies, then there is a true variation in dimensions on the wafer;

the constant threshold is determined by minimizing the difference between the constant threshold and each of the empirical thresholds;

the difference between the constant threshold and each of the empirical thresholds is minimized by using a method consisting of minimizing the quadratic RMS error;

the threshold is a variable threshold according to the category of patterns; For example, if one works on a lithography wafer with an FEM ("Focus Exposure Matrix"), there may be geometric variations in 2 dimensions (CD, height, angle). In this case, using a variable threshold may be useful since it enables multiple geometric variations to be taken in account;

the variable threshold is determined by:
  calculating an empirical variable threshold for each reference image of a same pattern category, n images being made on m patterns of said same category;
  minimizing the difference between the variable threshold and each of the empirical variable thresholds calculated;

each empirical variable threshold is a function of the reference critical dimension of the pattern category, of a reference height and/or reference angle of said pattern category;

said function is a second-degree polynomial;

the second-degree polynomial comprises a constant coefficient equal to the constant threshold;

the difference between the variable threshold and each of the empirical variable thresholds is minimized by using a method consisting of minimizing the quadratic RMS error;

the reference imaging instrumentation implements one of the following techniques:
  three-dimensional atomic force microscopy, or
  Transmission electron microscopy.

Other characteristics and benefices of the invention will clearly emerge from the description given below, for indicative and in no way limiting purposes, with reference to the attached figures, among which:

FIG. 1 schematically illustrates a secondary electron intensity profile as a function of the profile of a pattern obtained via the CD-SEM technique;

FIG. 2 represents the different steps of the method according to the invention;

FIG. 3 illustrates the principle of the step of determining an empirical threshold, FIG. 4 illustrates a first embodiment of the method illustrated in FIG. 2;

FIG. 5 illustrates a second embodiment of the method illustrated in FIG. 2;

FIG. 6 schematically represents a pattern as well as different dimensional parameters of this pattern.

FIG. 2 schematically illustrates the different steps of the method 100 according to the invention.

Method 100 according to the invention aims to determine an applicable threshold for determining the critical dimension of a pattern belonging to at least one category of patterns (holes, dots, line, trench, etc.) imaged by atomic force scanning electron microscopy. The pattern may be of any material.

This pattern may, for example, be an isolated pattern or may belong to a network of patterns that are repeated periodically. It may be a pattern obtained after any step whatsoever (lithography, etching, etc.) of a production process.

We will illustrate the implementation of method 100 in the case of patterns such as the pattern (dot) M represented in FIG. 6.

This method 100 comprises the following steps:
from a plurality of patterns (such as pattern M from FIG. 6), acquisition 101 of a pair of images IM1, IM2 for each pattern M:
  a first image IM1 is obtained by means of an imaging instrumentation implementing the atomic force scanning electron microscopy technique, also known as CD-SEM instrumentation, which one seeks to determine the threshold (i.e., the applicable threshold);
  a second image IM2 is obtained by means of a reference imaging instrumentation implementing a technique different from the scanning electron microscopy technique, for example three-dimensional atomic force microscopy (or CD-AFM for "Critical Dimension—Atomic Force Microscopy");

for each pair of images IM1, IM2 obtained for each of the patterns M:
  determination 102 of a reference critical dimension $CD_{REF}$ via the image IM2 obtained by means of the reference imaging instrumentation;
  determination 103 of an empirical threshold $S_{EMP}$ applicable to image IM1 obtained by means of the CD-SEM instrumentation such that the empirical threshold $S_{EMP}$ substantially corresponds to the reference critical dimension $CD_{REF}$ determined in the previous step 102,
  Determination 104 of a threshold S applicable to at least one category of patterns M, said threshold S being determined from a plurality of empirical thresholds $S_{EMP}$, each empirical threshold $S_{EMP}$ corresponding to a pair of images.

The operation consisting of determining an empirical threshold $S_{EMP}$ is repeated on a plurality of patterns i (i varying from 1 to n, n being the number of patterns used to implement the method) for which a pair of images is used each time. In the rest of the description, $S_{EMP}(i)$ will designate the empirical threshold determined by the pair of images from pattern i.

As mentioned above, step 101 consists of carrying out, for each pattern i:
  a first image IM1(i) of the contour of pattern i obtained by means of a CD-SEM type imaging instrumentation; each image IM1(i) is then recorded in a matrix of images;
  A second image IM2(i) of the contour of the pattern obtained by means of a reference imaging technique, for example three-dimensional atomic force microscopy (or CD-AFM for "Critical Dimension—Atomic Force Microscopy"), or transmission electron microscopy (or TEM), this reference imaging technique being more precise than CD-SEM. Scatterometry may also be used to produce the second image IM2(i). This image IM2(i) enables a precise slice image of the pattern, the critical dimension of which one attempts to determine, to be provided; each image IM2(i) is then recorded in a matrix of images.

Step 102 consists of, for each pattern i, determination of a reference critical dimension $CD_{REF}(i)$ via the image obtained by means of the reference imaging instrumentation.

Step 103 consists of, for each pattern i, determination of an empirical threshold $S_{EMP}(i)$ applicable to image IM1(i) obtained by means of the CD-SEM instrumentation such that the empirical threshold $S_{EMP}(i)$ substantially or even exactly corresponds to the reference critical dimension $CD_{REF}(i)$. More specifically, FIG. 3 illustrates a secondary electron intensity profile IP of a pattern i imaged by means of the CD-SEM imaging technique, the intensity profile IP being, for example, drawn via a program used to carry out CD-SEM measurements well known to the person skilled in the art. The y-axis represents a percentage of secondary electrons and the x-axis represents a dimension in nm. Thus, for a reference critical dimension $CD_{REF}(i)$ determined by means of the reference imaging technique, an empirical threshold $S_{EMP}(i)$ substantially corresponding to the reference critical dimension $CD_{REF}(i)$ is deduced. In the example illustrated, for a reference critical dimension $CD_{REF}(i)$ of 2 nm, the corresponding empirical threshold $S_{EMP}(i)$ is 30% of secondary electrons.

Step 104 consists of determining a threshold S applicable to at least one category of patterns, this threshold S being determined from the plurality of empirical thresholds $S_{EMP}(i)$ previously obtained for each pattern i, each empirical threshold $S_{EMP}(i)$ corresponding to a pair of images IM1, IM2 corresponding to pattern i. The threshold S applicable to at least one pattern category may be:
- a constant threshold $S_{CTR}$ applicable to all categories of patterns, or
- A variable threshold $S_{VTR}$ applicable to a category of patterns.

As illustrated in FIG. 4, according to a first embodiment of the invention, step 104 of determining a threshold may be carried out according to a first approach consisting of determining a constant threshold $S_{CTR}$ applicable to all categories of patterns.

In this case, to determine the constant threshold $S_{CTR}$, a set threshold value (for example 80%) is chosen and the CD measurements are determined from images IM1 obtained by CD-SEM on a plurality of patterns from different categories. Then this constant threshold $S_{CTR}$ is determined by minimizing 104a the difference between these CD values measured by CD-SEM and the CD values measured by the reference imaging technique, the CD values being contained in the image matrices. In other words, the constant threshold is determined by minimizing the difference between the constant threshold $S_{CTR}$ and the different empirical thresholds $S_{EMP}(I)$ enabling us to approach the reference CD measurements. The difference between the constant threshold $S_{CTR}$ and each of the empirical thresholds $S_{EMP}(i)$ is minimized 104a, for example by using a method consisting of minimizing the quadratic RMS error via the following formula:

$$RMS\ Error = \frac{\sqrt{\Sigma_{Images-CDSEM}\ w(i)(S_{CTR} - S_{EMP}(i))^2}}{\sqrt{\Sigma_{Images-CDSEM}\ w(i)}}$$

where:
- w(i) is a weighting coefficient attributed to measurement (i), the weight depending on the experience of the user and on the significance that one wishes to give to the image and therefore to the pattern category,
- $S_{CTR}$ is the constant threshold, and
- $S_{EMP}(i)$ is the empirical threshold calculated for measurement (i).

The constant threshold thus calculated is then applicable in research and development or in production on each pattern imaged by CD-SEM. More specifically, the constant threshold is applicable to all categories of the pattern, regardless of their geometries, for example for dots, trenches or else lines.

As illustrated in FIG. 5, according to a second embodiment of the invention, step 104 of determining a threshold may be carried out according to a different approach consisting of determining a variable threshold $S_{VTR}$ applicable to a single pattern category or to a plurality of pattern categories.

In the case of a single pattern category, a variable threshold $S_{VTR}$ is determined for each pattern category. It should be noted that this second approach is more accurate than that of the constant threshold presented previously with relation to FIG. 4.

The variable threshold $S_{VTR}$ is determined by:
- calculating 104b an empirical variable threshold $S_{VTRE}(i)$ for each reference image IM2(i) from a same pattern category, n images IM2(i) (with i varying from 1 to n) being made on m patterns from the same category,
- minimizing 104c the difference between the variable threshold $S_{VTR}$ and each of the empirical variable thresholds $S_{VTRE}(i)$.

According to this second embodiment, to determine an empirical variable threshold $S_{VTRE}(i)$, several parameters in addition to the critical dimension CD are taken into account, for example the SWA angle formed between the side of the pattern M and the substrate S or else the height h of the pattern M (see FIG. 6). It is understood that other parameters may be taken into account without necessarily departing from the scope of the invention. In other words, $S_{VTRE}(i)$ is a function of three parameters (here the CD, the SWA angle and the height h). This is more accurate in the end since the approach is an approach of reducing overall uncertainty.

Therefore an empirical variable threshold $S_{VTRE}(i)$ is calculated for each image IM2(i) from a same pattern category (for example dots) obtained via the reference imaging technique, n images IM2(i) (with i varying from 1 to n) being made via reference imaging on m dots. In a non-limiting manner, this empirical variable threshold $S_{VTRE}(i)$ may be calculated via a second-degree polynomial in conformance with that below:

$$S_{VTRE}(i) = C_0 + C_1 CD_{REF} + C_2 SWA_{REF} + C_3 H_{REF} + \\ C_4 CD^2_{REF} + C_5 SWA^2 + C_6 H^2_{REF} + \\ C_7 CD_{REF} SWA_{REF} + C_8 CD_{REF} H_{REF} + \\ C_9 H_{REF} SWA_{REF}$$

It should be noted that the polynomial is preferentially a second-degree polynomial, but may be of a higher degree. In addition, the three variables are not limiting and other variables may be used.

In a non-limiting embodiment, the coefficient $C_0$ is equal to the constant threshold $S_{CTR}$. In this case, coefficient $C_0$ equal to the constant threshold $S_{CTR}$ is determined by minimizing 104a the difference between the constant threshold $S_{CTR}$ and each of the empirical thresholds $S_{EMP}(i)$ in conformance with the first embodiment of the invention previously described and illustrated by means of FIG. 4.

In another embodiment, coefficient $C_0$ is set arbitrarily, for example 80%. This coefficient $C_0$ may also be calculated differently, To solve the aforementioned second-degree polynomial, one attempts to optimize the coefficients $C_k$ (k varying from 1 to m). Optimization of coefficients $C_k$ is carried out by the resolution of the linear system below at n equations (number of measurements) and m unknowns (number of coefficients $C_k$ to be optimized, i.e m=9 in the example):

$$\begin{pmatrix} CD^{(1)}_{REF} & \cdots & H^{(1)}_{REF} & SWA^{(1)}_{REF} \\ | & \backslash & & | \\ CD^{(n)}_{REF} & \cdots & H^{(n)}_{REF} & SWA^{(n)}_{REF} \end{pmatrix} \begin{pmatrix} C_1 \\ | \\ C_m \end{pmatrix} = \begin{pmatrix} S^{(1)}_{EMP} - C_0 \\ | \\ S^{(n)}_{EMP} - C_0 \end{pmatrix}$$

Thus a plurality of empirical variable thresholds $S_{VTRE}(i)$ is obtained, each of the empirical variable thresholds $S_{VTRE}(i)$ corresponding to an image of a pattern and the plurality of patterns belonging to a same category (of dots in the example).

Next, one attempts to minimize 104c the difference between the variable threshold to be determined $S_{VTR}$ and each of the empirical variable thresholds $S_{VTRE}(i)$, enabling us to approach the reference CD measurements. The difference between the variable threshold $S_{VTR}$ (i.e., variable as a function of the pattern category) and each of the empirical variable thresholds $S_{VTRE}(i)$ is minimized 104c, for example by using a method consisting of minimizing the quadratic RMS error via the following formula:

$$RMS\ Error = \frac{\sqrt{\Sigma_{Images\text{-}CDSEM}\,w(i)(S_{VTR} - S_{VTRE}(i))^2}}{\sqrt{\Sigma_{Images\text{-}CDSEM}\,w(i)}}$$

w(i) is a weighting coefficient attributed to measurement (i), the weight depending on the experience of the user and on the significance that one wishes to give to the image and therefore to the pattern category, $S_{VTR}$ is the variable threshold, and $S_{VTRE}(i)$ is the empirical variable threshold calculated for measurement (i).

The variable threshold thus calculated for a pattern category is then applicable in research and development or in production on each pattern of this category imaged by CD-SEM.

It is understood that the invention is not limited to the embodiment that has just been described, particularly in that relating to calculating the empirical variable threshold.

Thus, even if each of the empirical variable thresholds have been determined via a second order function taking a critical dimension, an angle and a height into account, it is understood that any other function type and/or parameters may be used without necessarily departing from the scope of the invention.

In addition, as indicated previously, step 104 of determining a threshold may consist of determining a variable threshold $S_{VTR}$ applicable to a plurality of pattern categories, for example for a same gate level. In this case, the variable threshold is determined first in the etching step and subsequently in the lithography step.

The invention claimed is:

1. A method of determining an applicable threshold for determining the critical dimension of at least one category of patterns imaged by atomic force scanning electron microscopy, said method comprising:
from a plurality of patterns, acquiring a pair of images for each pattern, the acquiring comprising
obtaining a first image by an imaging instrumentation implementing an atomic force scanning electron microscopy technique which one seeks to determine the threshold;
obtaining a second image by a reference imaging instrumentation implementing a different technique from said scanning electron microscopy technique;
for each pair of images obtained for each of the patterns:
determining a reference critical dimension via the image obtained by said reference imaging instrumentation;
determining an empirical threshold applicable to the image obtained by said atomic force scanning electron microscopy instrumentation such that said empirical threshold substantially corresponds to said reference critical dimension;
determining a threshold applicable to at least one category of patterns, said threshold being determined from a plurality of empirical thresholds, each empirical threshold corresponding to a pair of images.

2. The method according to claim 1, wherein the threshold is a constant threshold applicable to all pattern categories.

3. The method according to claim 2, wherein the constant threshold is determined by minimizing the difference between the constant threshold and each of the empirical thresholds.

4. The method according to claim 3, wherein the difference between the constant threshold and each of the empirical thresholds is minimized by minimizing the quadratic RMS error.

5. The method according to claim 1, wherein the threshold is a variable threshold according to the category of patterns.

6. The method according to claim 5, wherein the variable threshold is determined by:
calculating an empirical variable threshold for each reference image of a same pattern category, n images being made on m patterns of said same category;
minimizing the difference between the variable threshold and each of the empirical variable thresholds calculated.

7. The method according to claim 6, wherein each empirical variable threshold is a function of the reference critical dimension of the pattern category, of a reference height and/or reference angle of said pattern category.

8. The method according to claim 7, wherein said function is a second-degree polynomial.

9. The method according to claim 8, wherein the second-degree polynomial comprises a constant coefficient equal to the constant threshold.

10. The method according to claim 6, wherein the difference between the variable threshold and each of the empirical variable thresholds is minimized by minimizing the quadratic RMS error.

11. The method according to claim 1, wherein the reference imaging instrumentation implements one of the following techniques:
three-dimensional atomic force microscopy, or
Transmission electron microscopy.

* * * * *

UNITED STATES PATENT AND TRADEMARK OFFICE
CERTIFICATE OF CORRECTION

| | |
|---|---|
| PATENT NO. | : 8,723,116 B2 |
| APPLICATION NO. | : 13/886371 |
| DATED | : May 13, 2014 |
| INVENTOR(S) | : Johann Foucher et al. |

Page 1 of 1

It is certified that error appears in the above-identified patent and that said Letters Patent is hereby corrected as shown below:

On title page, item (72) Inventors
replace "Mazan Saled, Meylan (FR)"
with --Mazen Saied, Meylan (FR)--.

In the Specification
Column 1, directly after the title of the invention (lines 1-6)
insert the following:

--CROSS-REFERENCE TO RELATED APPLICATIONS

This application is based upon and claims the benefit of priority from French Patent Application No. 1254130, filed May 4, 2012, the entire content of which is incorporated herein by reference.--.

Signed and Sealed this
Fifteenth Day of July, 2014

Michelle K. Lee
*Deputy Director of the United States Patent and Trademark Office*